United States Patent [19]

Iga et al.

[11] 4,121,205
[45] Oct. 17, 1978

[54] DIGITAL TO ANALOG CONVERTER WITH POWER AMPLIFICATION

[75] Inventors: Akira Iga, Tokyo; Toshitada Doi, Yokohama, both of Japan

[73] Assignee: Sony Corporation, Tokyo, Japan

[21] Appl. No.: 764,526

[22] Filed: Jan. 31, 1977

[30] Foreign Application Priority Data

Feb. 6, 1976 [JP] Japan .................................. 51-11905

[51] Int. Cl.² ........................................... H03K 13/05
[52] U.S. Cl. ........................................... 340/347 DA
[58] Field of Search .................... 340/347 M, 347 DA

[56] References Cited
U.S. PATENT DOCUMENTS

| | | |
|---|---|---|
| 2,916,734 | 12/1959 | Spencer ........................ 340/347 DA |
| 2,920,217 | 1/1960 | House ............................. 340/347 M |
| 2,949,600 | 8/1960 | Le May .......................... 340/347 M |
| 2,970,308 | 1/1961 | Stringfellow ................ 340/347 DA |
| 3,426,345 | 2/1969 | Kase ............................. 340/347 DA |
| 3,898,568 | 8/1975 | Barth ........................... 340/347 DA |
| 3,967,272 | 6/1976 | Sandford ..................... 340/347 DA |

*Primary Examiner*—Charles D. Miller
*Attorney, Agent, or Firm*—Lewis H. Eslinger; Alvin Sinderbrand

[57] ABSTRACT

A power amplifier has an input terminal supplied with a PCM (pulse code modulated) signal and a plurality of power supplies, each producing a voltage weighted according to the order of bits of the PCM-code. Switching means are controlled by the PCM input signal to connect selective ones of the power supplies in series to a load in response to the PCM signal.

8 Claims, 2 Drawing Figures

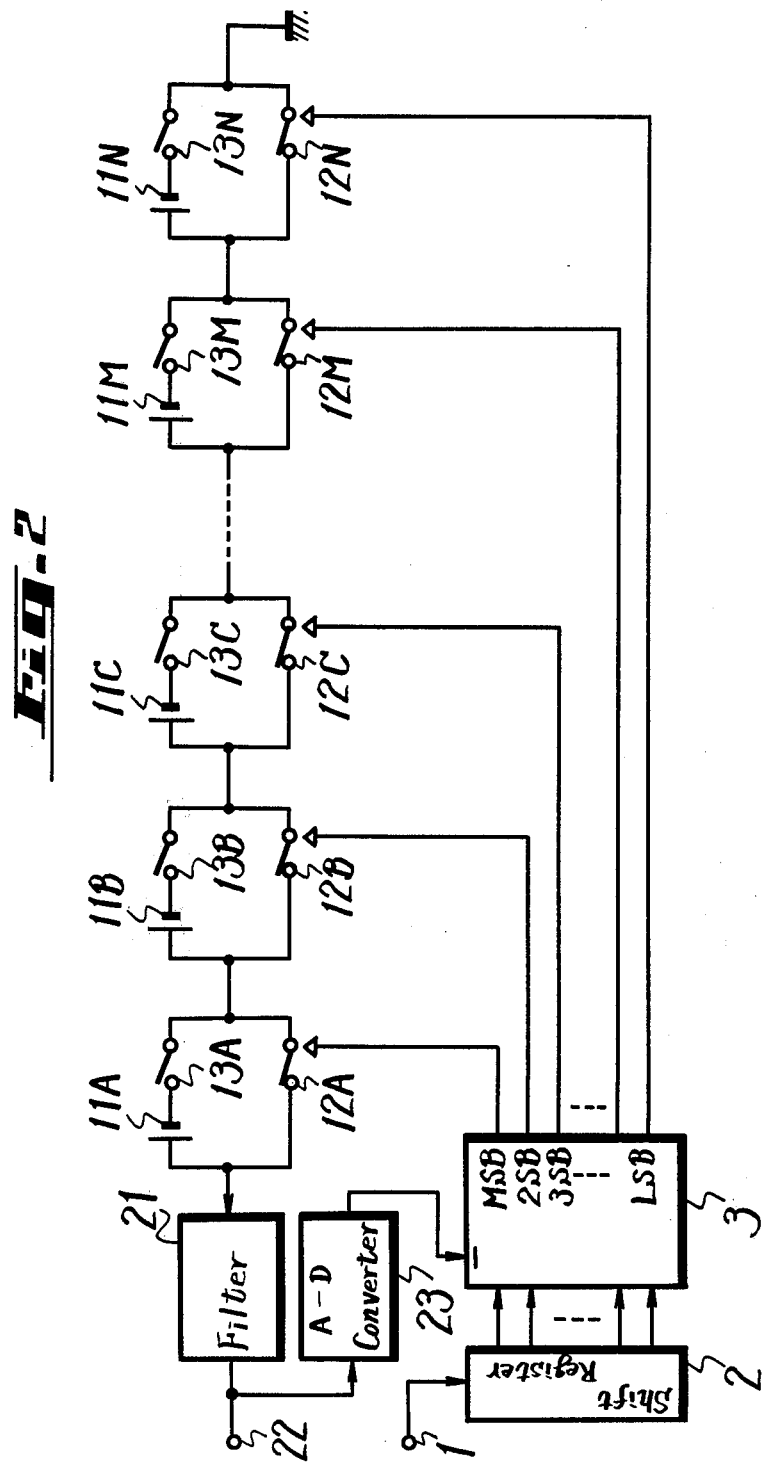

DIGITAL TO ANALOG CONVERTER WITH POWER AMPLIFICATION

BACKGROUND OF THE INVENTION

1. Field of the Invention

The present invention relates generally to a power amplifier, and more particularly to a power amplifier capable of demodulating a PCM (pulse code modulated) signal and simultaneously producing power amplification.

2. Description of the Prior Art

Recently, in the audio art a digital technique has begun to be employed. According to such technique, and audio signal is converted into a PCM signal and then recorded and later reproduced. However, the transmission of a digital signal requires a wide transmission band as compared with the transmission of an analog signal and it is necessary to detect errors produced in the transmission system and to correct the errors, so that the digital signal transmission is effected in only a narrow area.

At present, the PCM technique in the audio art is employed mainly in the recording part of the whole signal transmission system from a microphone to a speaker but is not employed in an audio system comprising only an amplifier and a speaker. The digital signal which is recorded in a PCM recorder is demodulated back into an analog signal, and this analog signal is then amplified by an analog amplifier and fed to the speaker. Thus, the frequency characteristic of the amplifier and its distortion characteristic become a problem, and much power is consumed, which results in very low efficiency.

OBJECTS AND SUMMARY OF THE INVENTION

It is an object of the present invention to provide a power amplifier which is free from the defects of prior art analog amplifiers, and which demodulates a PCM-encoded audio signal back into analog from while at the same time, providing power amplification.

It is another object of the invention to provide a power amplifier which has low power consumption and, therefore, high efficiency while producing high power output.

It is a further object of the invention to provide a power amplifier which can convert a PCM signal to a PAM (pulse amplitude modulated) signal and can simultaneously achieve power amplification by a common element and is simple to construct.

It is a still further object of the invention to provide a power amplifier in which resistance is present in a switching element, even when the switching element is conductive, but the effect of this resistance can be neglected by introducing a negative feedback.

According to one aspect of the present invention, a power amplifier having an input terminal to which a PCM input signal is supplied, and an output terminal, from which an analog output signal is obtained in response to the PCM input signal, has plural power sources, each having a voltage value weighted according to a respective order of bits of the PCM input signal. The amplifier also has plural switching circuits controlled by the PCM input signal so as to connect the power sources selectively between the output terminal and a reference point in response to the PCM input signal.

The other objects, features and advantages of the present invention will become apparent from the following description taken in conjunction with the accompanying drawings.

BRIEF DESCRIPTION OF THE DRAWINGS

FIG. 2 is an equivalent circuit of FIG. 1.

DESCRIPTION OF THE PREFERRED EMBODIMENTS

Figure 1:
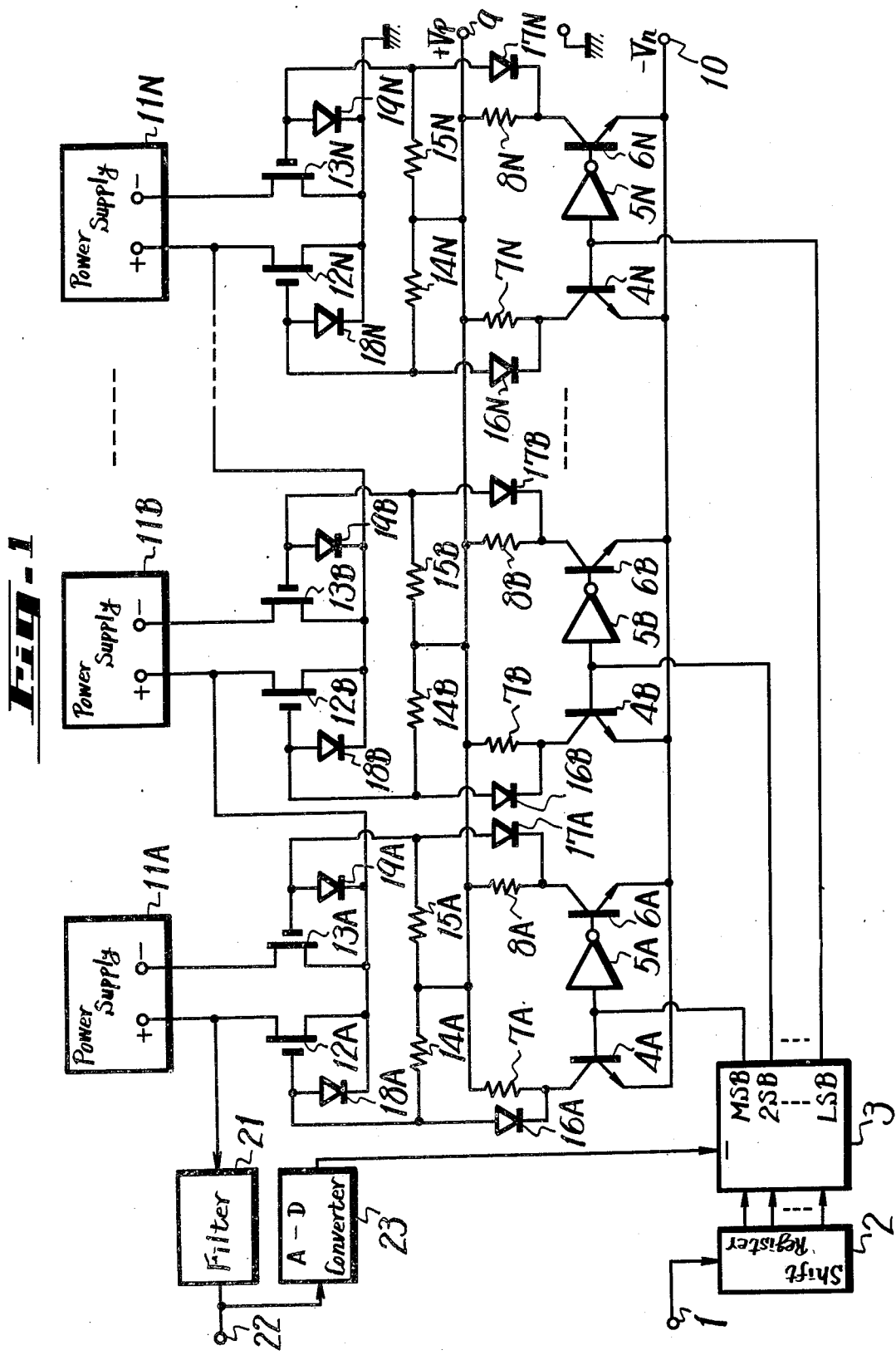
FIG. 1 is a connection diagram showing an example of the power amplifier according to the present invention.

An example of the power amplifier according to the present invention will be hereinafter described with reference to the drawings. A PCM pulse, which is to be amplified by the power amplifier of the invention, is prepared by sampling an audio signal $S_a$ at a suitable sampling frequency and converting the pulse signal heights of the sampled pulse into a series pulse of N-bits by natural binary-coded value (where N is, for example, 13). The binary value thereof becomes a minimum value at the negative peak at the maximum level of the original audio signal $S_a$ but becomes a maximum at the positive peak.

FIG. 1 is a circuit diagram, partially in block form, showing an example of a power amplifier according to the present invention. In FIG. 1, the amplifier has an input terminal 1 which is supplied with the above PCM pulse signal. The input terminal 1 is connected to a shift register 2 which converts the series pulse signal fed to the input terminal 1 into a parallel pulse signal. Output terminals of the shift register 2 at which the parallel pulses are derived are connected to a digital subtraction circuit 3 which subtracts from the input PCM pulses other PCM pulses obtained from an output signal to produce a negative feedback effect, as described later. The output terminals of the subtraction circuit 3, which correspond to the various bit orders from the MSB (most significant bit) to the LSB (least significant bit) of the PCM pulse, respectively, are connected to the bases of switching transistors 4A to 4N and to the bases of transistor 6A to 6N through inverters 5A to 5N, respectively. The collectors of the transistors 4A to 4N and 6A to 6N are connected through resistors 7A to 7N and 8A to 8N, respectively, to a positive bias terminal 9 to which a voltage of $+V_p$ is supplied. The emitters of all of the transistors 4A to 4N and 6A to 6N are connected together to a negative bias terminal 10 to which a voltage of $-V_n$ is supplied.

The circuit in FIG. 1 also includes constant voltage supply circuits 11A to 11N of the floating type which have output voltage valves in correspondence with the MSB to LSB of the PCM pulse. The power supply circuits 11A to 11N produce the following DC output voltages which are weighted according to the order from the MSB to LSB of the PCM pulse:

Output voltage of circuit 11A = $2^{(N-1)} E$

Output voltage of circuit 11B = $2^{(N-2)} E$

Output voltage of circuit 11N = $2^{(N-N)} E$ where $E$ represents a unit voltage by quantization. The positive output terminals of the power supply circuits 11A to 11N are connected to the drains electrodes of a plurality of switching FETs (field effect transistors), such as MOS-FETs 12A to 12N, and the negative output terminals of the power supply circuits 11A to 11N are connected to the drain electrodes of another set of switching FETs, such as MOS-FETs 13A to 13N, respectively. The sources of FETs 12A and 13A, ... 12N and 13N are connected together, respectively. The gates of the FETS 12A to 12N are connected through resistors 14A to 14N to the terminal 9 and through diodes 16A to 16N to the collectors of the transistors 4A to 4N, respectively. Similarly, the gates of FETs 13A to 13N are connected through resistors 15A to 15N, respectively, to the terminal 9 and through diodes 17A to 17N to the collectors of the transistors 6A to 6N, respectively. Diodes 18A to 18N and 19A to 19N for biasing only are connected between the gates and sources of the FETs 12A to 12N and 13A to 13N, respectively.

The sources of the FETs 12A and 13A are connected together to the positive output terminal of the power supply circuit 11B, and the sources of each of the other pairs of FETs corresponding to successively lower order bits are connected to the positive power supply terminal of the power supply circuit corresponding to the next lower order bit. The sources of the FETs 12N and 13N are both grounded. The positive output terminal of the power supply circuit 11A is connected through a filter 21, which eliminates sampling carrier components of the PCM signal, to an output terminal 22. A part of the output signal obtained at the terminal 22 is fed to an A-D converter 23 and converted into a pulse signal similar to the input PCM pulse. Then, this converted pulse signal obtained from the output terminal is fed back to the subtraction circuit 3 as a negative feedback signal.

The bias voltage $+V_p$ at the terminal 9 has a value corresponding to the output voltage $2^{(N-1)}E$ of the power supply circuit 11A, while the bias voltage $-V_n$ at the terminal 10 has a value corresponding to the pinch-off voltage of the FETs 12A to 12N and 13A to 13N.

With the power amplifier of the invention constructed as described, if the signal of, for example, LSB level in the output signals of the subtraction circuit 3 is "0", the transistor 4N is made non-conductive but the transistor 6N is made conductive. Since the transistor 6N is conductive, the diode 17N is biased forwardly through the resistor 15N by the positive bias voltage $+V_p$ and made conductive. Thus, the gate of the FET 13N is clamped through the diode 17N and transistor 6N at the level of the voltage $-V_n$ fed to the terminal 9, so that the FET 13N becomes non-conductive. Further, since the transistor 4N is non-conductive, the diode 16N is also non-conductive. Accordingly, the gate of the FET 12N is clamped at a voltage which is a voltage divided value of the voltage $+V_p$ at the terminal 9 as determined by a voltage divider comprising the resistor 14N and diode 18N. As a result, the FET 12N becomes conductive.

If the output signal of the subtraction circuit 3 corresponding to the LSB is "1", the transistor 4N becomes conductive but the transistor 6N becomes non-conductive. Therefore, the FET 12N becomes non-conductive but the FET 13N becomes conductive.

Accordingly, the connection of the power supply circuit 11N and FETs 12N, 13N can be considered to be connected as the power supply source 11N and switches 12N, 13N in the equivalent circuit in FIG. 2. Switches (FETs) 12M, 13M correspondence to a bit higher than the LSB by one bit are a series circuit of the power supply source 11N and switch 13N in the lower LSB-bit by one or biased through the switch 12N and made ON and OFF in correspondence with the bit. The same can be said on the other bits. Thus, FIG. 2 can be considered as an equivalent circuit of FIG. 1. As in the circuit in FIG. 1 the switches 12A to 12N in FIG. 2 are made conductive when their corresponding bit signals are "0" but non-conductive when their corresponding bit signal are "1", and the switches 13A to 13N become non-conductive when their bit signals are "0" and "1", respectively.

Thus, when the PCM pulse signal is supplied to the input terminal 1, the switches 12A to 12N and 13A to 13N are made conductive and non-conductive at every one period of the input PCM pulse train in correspondence with the code of the pulse. As a result, the power supply sources 11A to 11N are selectively connected in series in correspondence with the pulse code, so that the filter 21 is supplied with the PAM pulse converted from the PCM pulse. Thus, the original audio signal $S_a$ can be obtained at the output terminal 22. At this time, a part of the audio signal $S_a$ at the terminal 22 is converted back into a PCM signal by the A-D converter 23 and then fed to the subtraction circuit 3 in which this PCM pulse is subtracted from the input PCM pulse to act like a negative feedback signal.

When the demodulated output is derived at the output terminal 22, the weighted power supply sources 11A to 11N are selectively connected in series in accordance with the input PCM pulses. Thus, the demodulated output can be derived as a power signal. That is, power amplification can be achieved by the circuit shown in FIG. 1.

As described above, according to the power amplifier of the present invention, the PCM pulse can be demodulated and at the same time the demodulated output can be power-amplified. In this case, since the FETs 12A to 12N and 13A to 13N carry out switching operations, the power amplifier of the invention theoretically consumes substantially no power and hence has a high efficiency and can produce a high power output.

Further, with the invention the conversion from PCM to PAM and the amplification of power are carried out by the same components, so that the circuit construction of the invention becomes simple as compared with the prior art circuits in which the PCM-PAM conversion is carried out and thereafter the power of the resulting signal is amplified.

Further, according to the invention even if the FETs 12A to 12N and 13A to 13N have resistance when they are conductive, such resistance can be neglected because of the negative feedback.

The above description is given for only one preferred embodiment of the present invention, but it may be apparent that many modifications and variations could be effected by one skilled in the art without departing from the true scope of the invention. Therefore, the scope of the invention should be determined by the following claims only.

1. A power amplifier comprising:
an input terminal supplied with a PCM input signal;
an output terminal;
a reference voltage terminal;
plural power sources each having a voltage value weighted according to an order of bits of said PCM input signal;
plural switching circuit means controlled by said PCM input signal to connect said power sources selectively between said output terminal and said reference terminal in response to said PCM input signal to produce an analog output signal at said output terminal in response to said PCM input signal;

an analog-to-digital converter connected to said output terminal for converting said analog output signal to a digital signal; and a digital subtraction circuit having inputs connected to said input terminal and said analog-to-digital converter and outputs connected to said plural switching circuit means for producing a feedback effect to compensate for losses due to resistance in said plural switching circuit means.

2. A power amplifier according to claim 1 in which said PCM signal contains PCM sampling carrier components, said amplifier further comprising filtering means connected between said power sources and said output terminal for eliminating said sampling carrier components from said output signal.

3. A power amplifier according to claim 1, further comprising converting means connected between said input terminal and said digital subtraction circuit to receive said PCM pulse signal from said input terminal, said PCM signal being a series PCM pulse signal, said converting means converting said series PCM signal to a parallel PCM pulse signal to control said switching circuit means.

4. A power amplifier according to claim 1, wherein each of said power sources is connectable in series through each of said switching circuit means.

5. A power amplifier according to claim 4 wherein each of said switching circuit means comprises a pair of switching devices, one of said switching devices being connected in series with each of said power sources to form a series circuit, and the other of said switching devices being connected in parallel with said series circuit.

6. A power amplifier according to claim 5 wherein each of said subtraction circuit outputs corresponds to a separate bit order of said PCM input signal and each of said switching circuit means includes a MOS-FET, said amplifier further comprising separate control circuit means connecting a specific one of said subtraction circuit outputs to each of said switching circuit means according to the bit order thereof.

7. A power amplifier according to claim 6 in which each of said MOS-FETs comprises source, drain, and gate electrodes, the source electrodes of the pair of said MOS-FETs connected to each of said power sources being connected together to the power source corresponding to the next lower bit level.

8. A power amplifier according to claim 7 in which each of said control circuit means comprises a transistor having an emitter-collector circuit connected between the gate electrode of the corresponding MOS-FET and a source of voltage having a value below the cut-off voltage of the respective MOS-FET, the two transistors connected to the two of said MOS-FET switching devices in each of said switching circuit means being connected to the same one of said subtraction circuit outputs, said control circuit means further comprising circuit means connected to said transistors to cause them to be alternatively conductive to control said two MOS-FET switching devices to be alternatively conductive.

* * * * *